(12) United States Patent
Inagaki

(10) Patent No.: US 7,463,742 B2
(45) Date of Patent: Dec. 9, 2008

(54) SIGNAL OUTPUT CIRCUIT

(75) Inventor: Yasuhiko Inagaki, Atsugi (JP)

(73) Assignee: Mitsumi Electric Co., Ltd. (JP)

( * ) Notice: Subject to any disclaimer, the term of this patent is extended or adjusted under 35 U.S.C. 154(b) by 852 days.

(21) Appl. No.: 10/786,816

(22) Filed: Feb. 24, 2004

(65) Prior Publication Data

US 2005/0024141 A1 Feb. 3, 2005

(30) Foreign Application Priority Data

Jul. 30, 2003 (JP) ............................. 2003-282847

(51) Int. Cl.
*H04B 15/00* (2006.01)
(52) U.S. Cl. ........................ 381/94.5; 330/51
(58) Field of Classification Search ............... 381/94.5, 381/94.1, 111, 120, 123, 116–117, 56; 330/252–253, 330/51, 149, 207
See application file for complete search history.

(56) References Cited

U.S. PATENT DOCUMENTS 5,642,074 A 6/1997 Ghaffaripour et al.
5,703,529 A * 12/1997 Ghaffaripour et al. ......... 330/51
6,255,903 B1 * 7/2001 Leffel ........................... 330/51
6,346,854 B1 * 2/2002 Heithoff ...................... 330/149
6,373,335 B1 * 4/2002 Carver .......................... 330/10
6,681,020 B1 * 1/2004 Papopoulos et al. ......... 381/122
7,161,424 B2 * 1/2007 Inagaki ......................... 330/51

FOREIGN PATENT DOCUMENTS

JP 2003-174693 6/2003

* cited by examiner

*Primary Examiner*—Vivian Chin
*Assistant Examiner*—Disler Paul
(74) *Attorney, Agent, or Firm*—Baker + Hostetler, LLP

(57) ABSTRACT

A signal output circuit for controlling output of an input signal is disclosed. The signal output circuit includes an internal circuit, a digital delay circuit delaying by digital processing a control signal for controlling the operation of the internal circuit, and a switch muting the input signal in accordance with the output of the digital delay circuit.

3 Claims, 5 Drawing Sheets

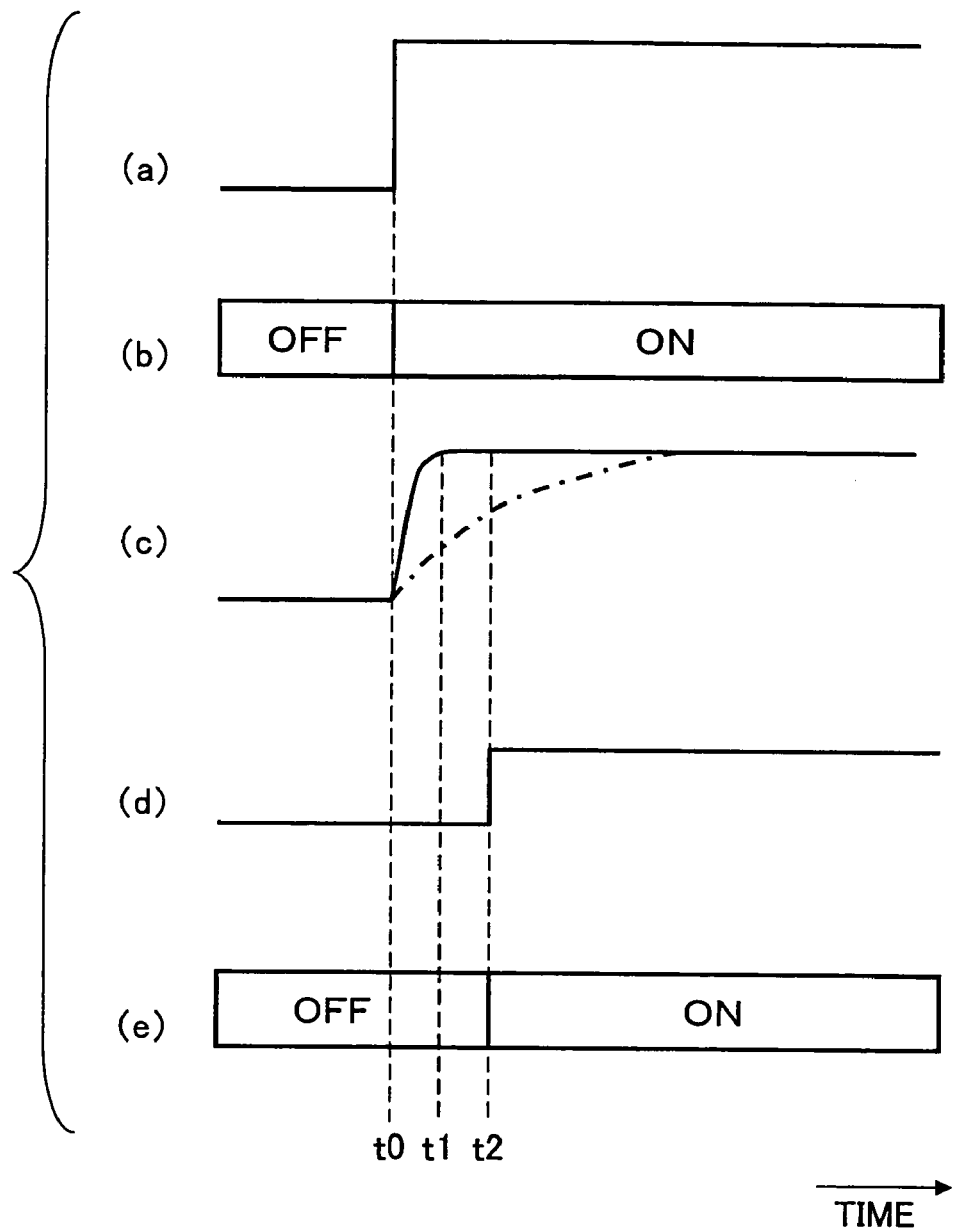

SIGNAL OUTPUT CIRCUIT

BACKGROUND OF THE INVENTION

1. Field of the Invention

The present invention relates generally to signal output circuits, and more particularly to a signal output circuit having the function of shutting down the operation of an internal circuit (a shutdown function) and the function of muting a signal (a mute function).

2. Description of the Related Art

A conventional audio amplifier circuit that amplifies an audio signal and outputs the audio signal to headphones or a speaker is known.

Such an audio amplifier circuit has a shutdown function and a mute function for cutting noise at the time of turning on or turning off power.

FIG. 1 is a block diagram showing a conventional audio amplifier circuit 101.

An input signal is supplied from a signal source 102 to the input terminal $T_{in}$ of the audio amplifier circuit 101 via a capacitor C41 for cutting a direct current. The input signal supplied to the input terminal $T_{in}$ is supplied to an amplifier circuit 111. The amplifier circuit 111 includes a differential amplifier circuit 121, an input resistor R31, a feedback resistor R32, and a switch 122, and has a reference voltage applied thereto from a reference voltage generator circuit 112, thus forming an inverting amplifier circuit.

The amplifier circuit 111 outputs a signal that is a function of the difference between the reference voltage from the reference voltage generator circuit 112 and the input signal supplied to the input terminal $T_{in}$. The signal amplified by the amplifier circuit 111 is output from an output terminal $T_{out}$ to drive a speaker 103.

The switch 122 is provided between the connection point of the input resistor R31 and the feedback resistor R32 and the inverting input terminal of the differential amplifier circuit 121. The switch 122 is switched in accordance with a mute signal supplied from a controller 104 to a control terminal $T_{cnt1}$. When the level of the mute signal is HIGH, the switch 122 short-circuits the connection point of the input resistor R31 and the feedback resistor R32 and the inverting input terminal of the differential amplifier circuit 121 so that the input signal is inverted and amplified to be output from the output terminal $T_{out}$.

When the level of the mute signal is LOW, the switch 122 short-circuits the output of the differential amplifier circuit 121 and its inverting input terminal, thereby causing a mute state so as to prevent the input signal from being output from the output terminal $T_{out}$. Thus, the switch 122 is switched in accordance with the mute signal supplied from the controller 104 to the control terminal $T_{cnt1}$, so that the supply of the input signal to the differential amplifier circuit 121 is controlled. As a result, the mute function is controlled.

The reference voltage generator circuit 112 includes a switch 131, resistors R41 and R42, and a capacitor C51. A constant voltage $V_{dd}$ is applied to the reference voltage generator circuit 112. The constant voltage $V_{dd}$ is applied via the switch 131 to a series circuit formed of the resistors R41 and R42. When the level of a shutdown signal supplied from the controller 104 to a control terminal $T_{cnt2}$ is HIGH, the switch 131 is turned ON to apply the constant voltage $V_{dd}$ to the series circuit formed of the resistors R41 and R42. When the level of the shutdown signal is LOW, the switch 131 is turned OFF to stop the applying of the constant voltage $V_{dd}$ to the series circuit formed of the resistors R41 and R42.

When the switch 131 is ON, the resistors R41 and R42 divide the constant voltage $V_{dd}$ to generate the reference voltage. The generated reference voltage is supplied to the non-inverting input terminal of the differential amplifier circuit 121. As a result, the amplifier circuit 111 is put in an operating state. A terminal $T_c$ is connected to the connection point of the resistors R41 and R42, and an external capacitor C51 is connected to the terminal $T_c$. The capacitor C51 connected to the terminal $T_c$ absorbs the ripple of the reference voltage to stabilize the reference voltage.

Next, a description is given of the operation of the audio amplifier circuit 101.

FIG. 2 is a diagram for illustrating the operation of the audio amplifier circuit 101. In FIG. 2, (a) indicates the shutdown signal output from the controller 104, (b) indicates the switching of the switch 131, (c) indicates the reference voltage supplied to the differential amplifier circuit 121, (d) indicates the mute signal output from the controller 104, and (e) indicates the switching of the switch 122.

Referring to FIG. 2, when the level of the shutdown signal switches from LOW to HIGH at a time t10 as shown in (a), the switch 131 is switched from OFF state to ON state as shown in (b). As a result of the switching of the switch 131 to ON state, the reference voltage is generated by the resistors R41 and R42. At this point, as shown in (c), the reference voltage is caused by the external capacitor C51 to gradually rise to reach a predetermined level at a time t11. When the reference voltage reaches the predetermined level at the time t11, the differential amplifier circuit 121 is released from a shutdown state to enter an operating state.

The controller 104 counts a predetermined period of time since the time t10, when the level of the shutdown signal switches to HIGH. The controller 104 outputs the mute signal at a time t12, when the preset predetermined period of time passes, as shown in (d) of FIG. 2. The mute signal turns ON the switch 122 of the amplifier circuit 111 as shown in (e) of FIG. 2. As a result, the input signal is released from a mute state, and is amplified by the amplifier circuit 111 to be supplied to the speaker 103.

Thus, according to the conventional audio amplifier circuit 101, the generation of the reference voltage in the reference voltage generator circuit 112 is controlled based on the shutdown signal supplied from the controller 104. As a result, the operation of the amplifier circuit 111 is controlled, and thus, the shutdown function is controlled. Further, the mute function of the amplifier circuit 111 is controlled based on the mute signal supplied from the controller 104.

According to the conventional audio amplifier circuit, the shutdown signal and the mute signal should be input separately to an integrated circuit. This increases the number of external pins of the integrated circuit, thus making it difficult to reduce the size of the integrated circuit.

Therefore, in order to reduce the number of external pins, an audio amplifier circuit that controls both the shutdown function and the mute function in accordance with the level of the shutdown signal has been proposed (U.S. Pat. No. 5,642, 074).

According to the conventional audio amplifier circuit where the shutdown signal for controlling the shutdown function and the mute signal for controlling the mute function are separately supplied from an external controller and control the shutdown function and the mute function, respectively, it is necessary to generate the shutdown signal and the mute signal in the external controller, and it is necessary to control timing for generating these signals. This causes a problem in that a load is imposed on the processing of the controller.

According to the conventional audio amplifier circuit controlling both of the shutdown function and the mute function in accordance with the level of the shutdown signal, timing for controlling the shutdown function and timing for controlling the mute function cannot be determined with accuracy, so that in some cases, noise may be output when an amplifier is activated.

SUMMARY OF THE INVENTION

Accordingly, it is a general object of the present invention to provide a signal output circuit in which the above-described disadvantages are eliminated.

A more specific object of the present invention is to provide a signal output circuit that can control timing for canceling a shutdown function and timing for canceling a mute function at different times with accuracy using a single external control signal.

The above objects of the present invention are achieved by a signal output circuit for controlling output of an input signal, including: an internal circuit; a digital delay circuit delaying by digital processing a control signal for controlling an operation of the internal circuit; and a switch muting the input signal in accordance with a delayed output of the digital delay circuit.

According to the above-described signal output circuit, the muting of an input signal is performed by delaying a control signal controlling the operation of the internal circuit, such as a shutdown signal, by digital processing. Accordingly, there is no need to supply a mute signal separately from the control signal, so that the number of external terminals can be reduced. As a result, the chip size of an integrated circuit can be reduced.

Further, a delay period of time for which the control signal is delayed by the digital delay circuit is set so that the muting of the input signal is canceled after the internal circuit is activated by the control signal. Accordingly, the muting of the input signal can be canceled after it is ensured that the internal circuit is activated. Further, the delay period of time can be set with accuracy by digital processing by the digital delay circuit. Accordingly, it is possible to prevent noise from being output when power is turned on.

BRIEF DESCRIPTION OF THE DRAWINGS

Other objects, features and advantages of the present invention will become more apparent from the following detailed description when read in conjunction with the accompanying drawings, in which:

FIG. 5 is a diagram for illustrating the operation of the audio amplifier circuit according to the embodiment of the present invention.

DETAILED DESCRIPTION OF THE PREFERRED EMBODIMENTS

A description is given below, with reference to the accompanying drawings, of an embodiment of the present invention.

Figure 1:
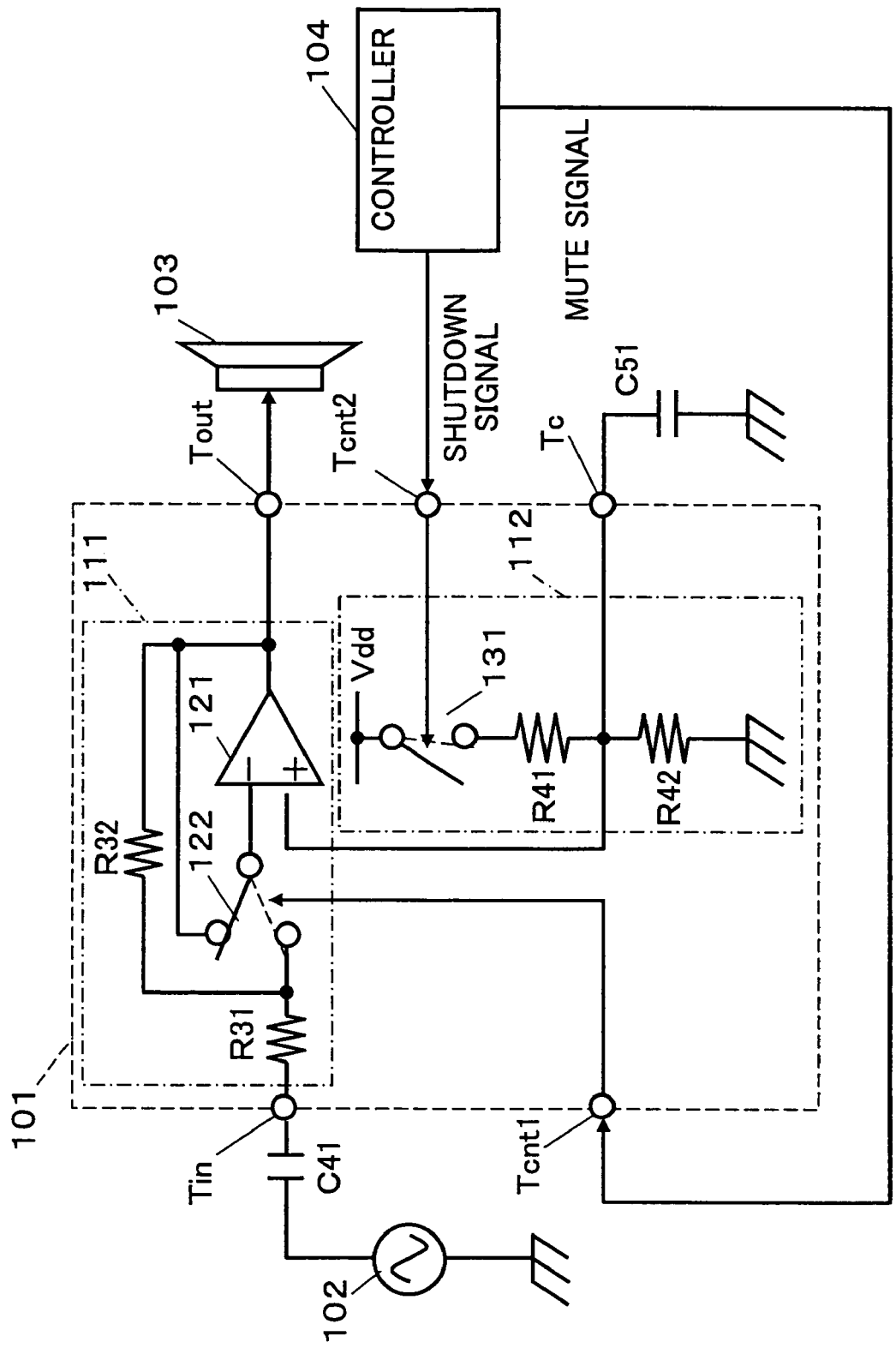
FIG. 1 is a block diagram showing a conventional audio amplifier circuit.
Figure 2:
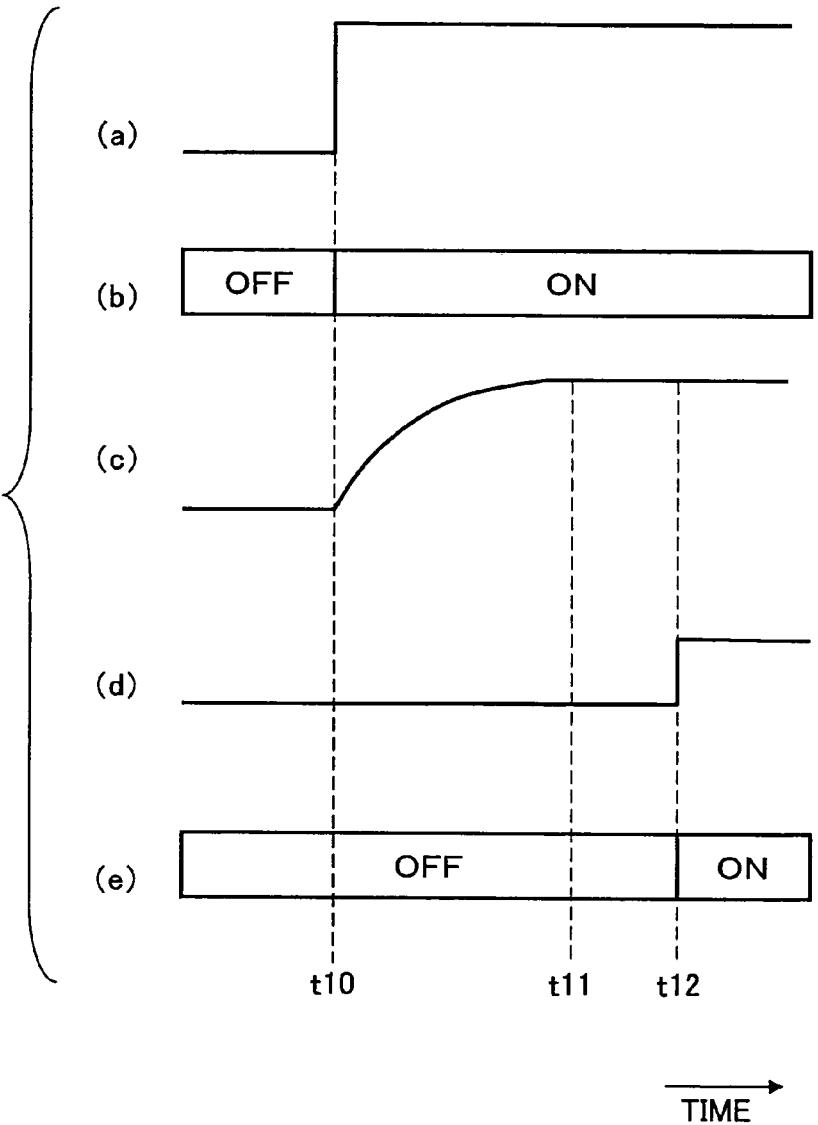
FIG. 2 is a diagram for illustrating the operation of the conventional audio amplifier circuit.
Figure 3:
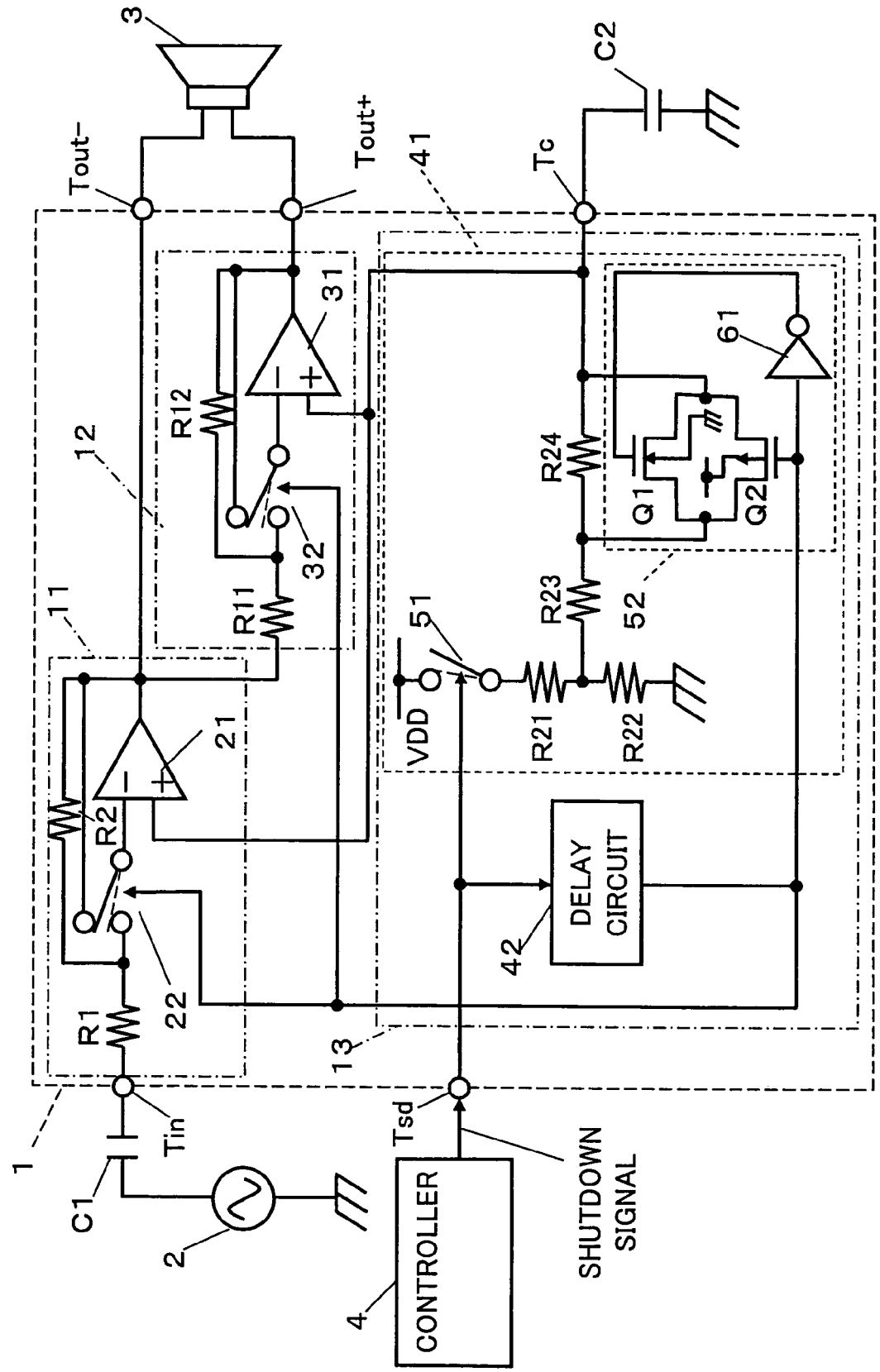
FIG. 3 is a block diagram showing an audio amplifier circuit according to an embodiment of the present invention.

FIG. 3 is a block diagram showing an audio amplifier circuit 1 according to the embodiment of the present invention.

The audio amplifier circuit 1 is composed of a single-chip semiconductor integrated circuit including amplifier circuits 11 and 12 and a function control circuit 13. The audio amplifier circuit 1 includes an input terminal $T_{in}$, an inverting output terminal $T_{out-}$, a non-inverting output terminal $T_{out+}$, a shutdown control terminal $T_{sd}$, and a terminal $T_c$ as external terminals. An input signal is supplied from a signal source 2 to the input terminal $T_{in}$ via a capacitor C1. A shutdown signal is supplied from a controller 4 to the shutdown control terminal $T_{sd}$. A speaker 3 is connected between the inverting and non-inverting output terminals $T_{out-}$ and $T_{out+}$. A capacitor C2 is connected to the terminal $T_c$.

The input signal supplied to the input terminal $T_{in}$ is supplied to the amplifier circuit 11. The amplifier circuit 11 includes an input resistor R1, a feedback resistor R2, a differential amplifier circuit 21, and a switch circuit 22, forming an inverting amplifier circuit. The amplifier circuit 11 inverts, amplifies, and outputs the input signal supplied to the input terminal $T_{in}$.

The switch circuit 22 is a circuit for realizing a mute function. The switch circuit 22 is connected between the connection point of the resistors R1 and R2 and the inverting input terminal of the differential amplifier circuit 21. The switch circuit 22 is turned ON when the level of a mute signal supplied from the function control circuit 13 is LOW, and is turned OFF when the level of the mute signal is HIGH. When the switch circuit 22 is turned ON, the switch circuit 22 short-circuits the connection point of the resistors R1 and R2 and the inverting input terminal of the differential amplifier circuit 21 so that the input signal is supplied to the inverting input terminal of the differential amplifier circuit 21. As a result, the muting of the input signal is canceled so that the amplifier circuit 11 inverts and amplifies the input signal.

When the switch circuit 22 is turned OFF, the switch circuit 22 disconnects the connection point of the resistors R1 and R2 and the inverting input terminal of the differential amplifier circuit 21, and short-circuits the output terminal and the inverting input terminal of the differential amplifier circuit 21. As a result, the amplifier circuit 11 mutes the input signal.

The output signal of the amplifier circuit 11 is output from the inverting output terminal $T_{out-}$ and is also supplied to the amplifier circuit 12.

The amplifier circuit 12 includes an input resistor R11, a feedback resistor R12, a differential amplifier circuit 31, and a switch circuit 32, forming an inverting amplifier circuit. The amplifier circuit 12 inverts and amplifies the signal supplied from the amplifier circuit 11, and outputs the signal from the non-inverting output terminal $T_{out+}$.

The switch circuit 32 is a circuit for realizing the mute function. The switch circuit 32 is connected between the connection point of the resistors R11 and R12 and the inverting input terminal of the differential amplifier circuit 31. The switch circuit 32 is turned ON when the level of the mute signal supplied from the function control circuit 13 is LOW, and is turned OFF when the level of the mute signal is HIGH. When the switch circuit 32 is turned ON, the switch circuit 32 short-circuits the connection point of the resistors R11 and R12 and the inverting input terminal of the differential amplifier circuit 31 so that the input signal is supplied to the inverting input terminal of the differential amplifier circuit 31. As a result, the muting of the input signal is canceled so that the amplifier circuit 12 inverts and amplifies the input signal.

When the switch circuit 32 is turned OFF, the switch circuit 32 disconnects the connection point of the resistors R11 and R12 from the inverting input terminal of the differential amplifier circuit 31, and short-circuits the output terminal and the inverting input terminal of the differential amplifier circuit 31. As a result, the amplifier circuit 12 mutes the input signal.

The output signal of the amplifier circuit 12 is output from the non-inverting output terminal $T_{out+}$.

The shutdown signal is supplied from the controller 4 to the shutdown control terminal $T_{sd}$. For instance, the controller 4 inverts the level of the shutdown signal from LOW to HIGH when power is turned on. The shutdown signal output from the controller 4 is supplied to the function control circuit 13.

The function control circuit 13 includes a reference voltage generator circuit 41 and a delay circuit 42. The reference voltage generator circuit 41 is a circuit for realizing a shutdown function, and includes a switch 51, resistors R21 through R24, and a bypass circuit 52. An external capacitor C2 is connected to the terminal $T_c$ of the reference voltage generator circuit 41.

The switch 51 is turned ON when the level of the shutdown signal is HIGH, and is turned OFF when the level of the shutdown signal is LOW. When the switch 51 is turned ON, a constant voltage $V_{dd}$ is applied to a series circuit formed of the resistors R21 and R22. The constant voltage $V_{dd}$ is divided between the resistors R21 and R22, and a divided voltage is output from the connection point of the resistors R21 and R22.

The connection point of the resistors R21 and R22 is connected via a series circuit formed of the resistors R23 and R24 to the non-inverting input terminal of the differential amplifier circuit 21 of the amplifier circuit 11 and the non-inverting input terminal of the differential amplifier circuit 31 of the amplifier circuit 12. The connection point of the resistor R24 and the non-inverting input terminals of the differential amplifier circuits 21 and 31 is connected to the terminal $T_c$.

The capacitor C2 is connected to the terminal $T_c$. The capacitor C2 absorbs variations in a (reference) voltage applied to the non-inverting input terminals of the differential amplifier circuits 21 and 31.

The bypass circuit 52 bypasses the resistor 24 when the switch 51 is turned ON. Without the bypass circuit 52, when the switch 51 is turned ON, the voltage applied to the non-inverting input terminals of the differential amplifier circuits 21 and 31 would rise with a delay of a time constant determined by the resistors R23 and R24 and the capacitor C2. Accordingly, in order to reduce the delay and activate the amplifier circuits 11 and 12 quickly, the bypass circuit 52 is provided.

The bypass circuit 52 includes CMOS (complementary metal oxide semiconductor) FETs (field effect transistors) Q1 and Q2 and an inverter 61, thus forming a transfer gate forming a transmission path bypassing the resistor R24. The output of the delay circuit 42 is applied to the gates of the MOS FETs Q1 and Q2. The MOS FETs Q1 and Q2 are switched ON when the level of the output of the delay circuit 42 becomes LOW, and are switched OFF when the output of the delay circuit 42 is delayed for a predetermined period of time so that the level thereof is switched to HIGH.

Accordingly, when the shutdown signal is supplied to turn the switch 51 ON, the bypass circuit 52 bypasses the resistor R24. As a result, the resistance is reduced. This increases a charging current for the capacitor C2 connected to the terminal $T_c$ so that the capacitor C2 is charged at high speed. Accordingly, the voltage applied to the non-inverting input terminals of the differential amplifier circuits 21 and 31 rises quickly, thus making it possible to cause the amplifier circuits 11 and 12 to operate early.

The delay circuit 42 is a circuit for controlling the mute signal. The delay circuit 42 delays the shutdown signal for a predetermined period of time and outputs the delayed shutdown signal as the mute signal. The predetermined period of time is set to a period of time required before it is ensured that the amplifier circuits 11 and 12 operate after the amplifier circuits 11 and 12 are activated based on the shutdown signal.

Figure 4:
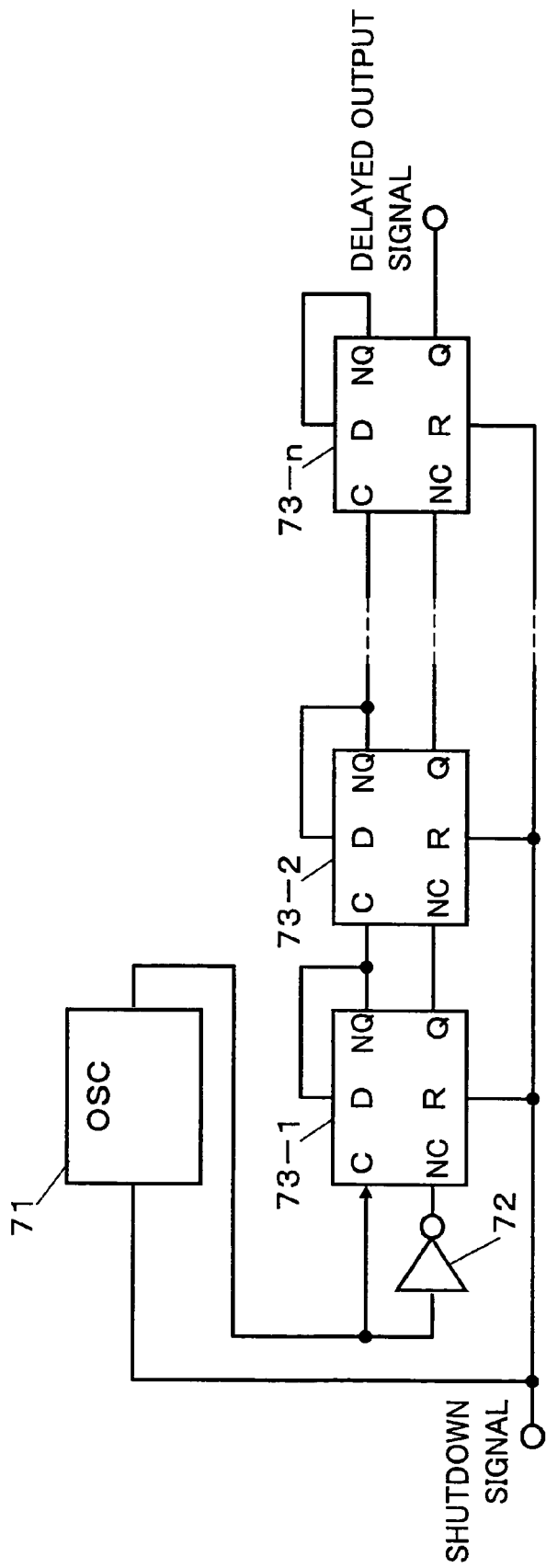
FIG. 4 is a block diagram showing a delay circuit of the audio amplifier circuit according to the embodiment of the present invention.

FIG. 4 is a block diagram showing the delay circuit 42.

The delay circuit 42 includes an oscillator circuit (OSC) 71, an inverter 72, and flip-flops 73-1 through 73-$n$, thus forming a logic timer.

When the level of the shutdown signal supplied to the shutdown control terminal $T_{sd}$ switches from LOW to HIGH, the oscillator circuit 71 starts to oscillate, and supplies the oscillation output to the inverter 72 and the flip-flop 73-1. The inverter 72 inverts and outputs the oscillation output of the oscillator circuit 71.

The flip-flops 73-1 through 73-$n$ are formed of D-type flip-flops. The shutdown signal is supplied to the reset terminal R of each of the flip-flops 73-1 through 73-$n$ so that the level of an output Q is reset to LOW by the shutdown signal. In the flip-flop 73-1, the oscillation output of the oscillator circuit 71 is supplied to a clock terminal C, the oscillation output inverted by the inverter 72 is supplied to the inverting clock terminal NC, and an inverting output terminal NQ is connected to a data terminal D. Further, the inverting output terminal NQ and a non-inverting output terminal Q are connected to the clock terminal C and the inverting clock terminal NC, respectively, of the flip-flop 73-2 at the next stage.

Such connection between the flip-flops 73-1 and 73-2 is performed on the n flip-flops 73-1 through 73-$n$. As a result, a so-called "up counter" is formed. The level of the output of the non-inverting output terminal Q of the flip-flop 73-$n$ at the last stage rises to HIGH after counting the oscillation output of the oscillator circuit 71 $2^n$ times. As a result, the delayed shutdown signal is output.

Thus, the delay circuit 42 forms a logic timer, and provides delay by digital processing. Accordingly, a delay period can be set with accuracy compared with the case of using a capacitor.

According to this embodiment, the delay circuit 42 is formed of a logic timer. The delay circuit 42, however, is not limited to this, and may employ any configuration that can set a delay period by digital processing.

Next, a description is given of an operation of the audio amplifier circuit 1 according to this embodiment.

FIG. 5 is a diagram for illustrating the operation of the audio amplifier circuit 1 according to this embodiment. In FIG. 5, (a) indicates the shutdown signal supplied from the controller 4 to the shutdown control terminal $T_{sd}$, (b) indicates the switching of the switch 51, (c) indicates the reference voltage applied to the non-inverting input terminals of the differential amplifier circuits 21 and 31, (d) indicates the output of the delay circuit 42, and (e) indicates the switching of the switch circuit 22 and 32.

Referring to FIG. 5, when the level of the shutdown signal switches from LOW to HIGH at a time t0 as shown in (a), the switch 51 is turned ON as shown in (b). At this point, the bypass circuit 52 is in the ON state. As a result, the external capacitor 2 is rapidly charged so that the reference voltage (of a predetermined level) is applied to the non-inverting input terminals of the differential amplifier circuits 21 and 31 at a time t1 as shown in (c).

Thereafter, at a time t2 (>t1), when a predetermined delay period of time ΔT passes since the time t0, the level of the output of the delay circuit 42 rises to HIGH as shown in (d), and the switch circuits 22 and 32 are turned ON as shown in (e). The switch circuits 22 and 32 are turned ON to cancel the muting of the input signal so that the input signal is amplified by the amplifier circuits 11 and 12 to be supplied to the speaker 3.

According to the audio amplifier circuit 1 of this embodiment, by only supplying the shutdown signal from the shutdown control terminal $T_{sd}$, a mute state (the muting of the input signal) can be canceled after a shutdown state (the shutdown of the internal circuit of the audio amplifier circuit 1) is canceled. That is, muting is performed by delaying the shutdown signal (control signal) by digital processing. Accordingly, there is no need to supply a mute signal separately from the shutdown signal from the controller 4. Therefore, the number of external terminals of the audio amplifier circuit 1 can be reduced. As a result, the chip size of the integrated circuit can be reduced. Further, the controller 4 may generate only the shutdown signal. Accordingly, the processing load on the controller 4 can be reduced.

Further, by generating the mute signal controlling the mute state by delaying the shutdown signal, the mute state can be canceled after the shutdown state is canceled. Accordingly, the input signal can be muted before activating the differential amplifier circuits 21 and 31. As a result, a great variation in output at the time of activating the differential amplifier circuits 21 and 31 can be prevented so that the amplifier circuits 21 and 31 can be activated smoothly.

That is, according to the present invention, the delay period of time $\Delta T$ is set so that the muting of the input signal is canceled after the differential amplifier circuits 21 and 31 are activated by the shutdown signal. Accordingly, the muting of the input signal can be canceled after it is ensured that the differential amplifier circuits 21 and 31 are activated. Further, the delay period of time $\Delta T$ can be set with accuracy by digital processing by the digital delay circuit 42. Accordingly, it is possible to prevent noise from being output when power is turned on.

The present invention is not limited to the specifically disclosed embodiment, and variations and modifications may be made without departing from the scope of the present invention.

The present application is based on Japanese priority patent application No. 2003-282847, filed on Jul. 30, 2003, the entire contents of which are hereby incorporated by reference.

What is claimed is:

1. A signal output circuit for controlling output of an input signal, comprising:
    an internal circuit;
    a digital delay circuit configured to delay, by digital processing, a control signal for controlling an operation of the internal circuit;
    a switch configured to mute the input signal in accordance with an output of the digital delay circuit,
    wherein the control signal is a shutdown signal shutting down the internal circuit;
    an amplifier circuit configured to amplify the input signal by comparing the input signal with a reference voltage;
    a reference voltage generator circuit configured to generate the reference voltage, the reference voltage gradually increasing in response to cancellation of the shutting down of the internal circuit; and
    a circuit configured to bypass a resistor of the reference voltage generator circuit in response to the cancellation of the shutting down of the internal circuit until the output of the digital delay circuit cancels the muting of the input signal, so as to accelerate the gradual increase of the reference voltage.

2. The signal output circuit as claimed in claim 1, wherein a period of time for which the control signal is delayed by the digital delay circuit is set so that the muting of the input signal is canceled after the internal circuit is activated based on the control signal.

3. The signal output circuit as claimed in claim 1, wherein the digital delay circuit comprises a logic timer.

* * * * *